United States Patent
Wu et al.

(10) Patent No.: US 10,825,894 B2
(45) Date of Patent: Nov. 3, 2020

(54) MIM CAPACITOR AND METHOD OF MANUFACTURING THE SAME

(71) Applicant: Taiwan Semiconductor Manufacturing Co., Ltd., Hsinchu (TW)

(72) Inventors: Tung-Jiun Wu, Hsinchu County (TW); Shun-Yi Lee, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/939,328

(22) Filed: Mar. 29, 2018

(65) Prior Publication Data

US 2019/0305078 A1 Oct. 3, 2019

(51) Int. Cl.
*H01L 49/02* (2006.01)
*H01L 21/311* (2006.01)
*H01L 21/285* (2006.01)
*H01L 21/768* (2006.01)
*H01L 23/532* (2006.01)
*H01L 21/02* (2006.01)

(52) U.S. Cl.
CPC .......... *H01L 28/91* (2013.01); *H01L 21/2855* (2013.01); *H01L 21/31111* (2013.01); *H01L 21/76805* (2013.01); *H01L 21/0214* (2013.01); *H01L 21/0217* (2013.01); *H01L 21/02164* (2013.01); *H01L 21/02271* (2013.01); *H01L 21/02282* (2013.01); *H01L 23/53238* (2013.01)

(58) Field of Classification Search
CPC ....................................................... H01L 28/75
See application file for complete search history.

(56) References Cited

U.S. PATENT DOCUMENTS

| | | | |
|---|---|---|---|
| 9,257,498 B1 * | 2/2016 | Hsu | H01L 28/60 |
| 9,761,655 B1 * | 9/2017 | Ando | H01L 28/75 |
| 2011/0108951 A1 * | 5/2011 | Cho | H01L 21/31144 257/532 |

* cited by examiner

*Primary Examiner* — Moazzam Hossain
*Assistant Examiner* — Hajar Kolahdouzan
(74) *Attorney, Agent, or Firm* — JCIPRNET

(57) ABSTRACT

Provided are MIM capacitor and method of manufacturing the same. The MIM capacitor includes a first electrode, a second electrode, a third electrode, a first insulating layer, a second insulating layer, and a first spacer. The first electrode and the third electrode are electrically connected to each other. The first insulating layer is between the first electrode and the second electrode. The second insulating layer is between the second electrode and the third electrode. The first spacer is located between a sidewall of the first electrode and the first insulating layer.

20 Claims, 13 Drawing Sheets

MIM CAPACITOR AND METHOD OF MANUFACTURING THE SAME

BACKGROUND

In the integrated circuits, MIM capacitors are components used for data storage applications. Various capacitive structures are applied in the integrated circuits. These structures include metal-oxide-semiconductor (MOS) MIM capacitors, p-n junction MIM capacitors and metal-insulator-metal (MIM) capacitors. Generally, the MIM capacitors exhibit improved frequency and temperature characteristics and a topology of a MIM capacitor simplifying planarization in the manufacturing processes.

The MIM capacitors have been widely used in functional circuits such as mixed-signal circuits, analog circuits, radio frequency (RF) circuits, dynamic random access memories (DRAMs), embedded DRAMs and logic operation circuits. Therefore, there are constant needs for a method of forming a MIM capacitor to provide a MIM capacitor with improved reliability.

DETAILED DESCRIPTION

Figure 1A:
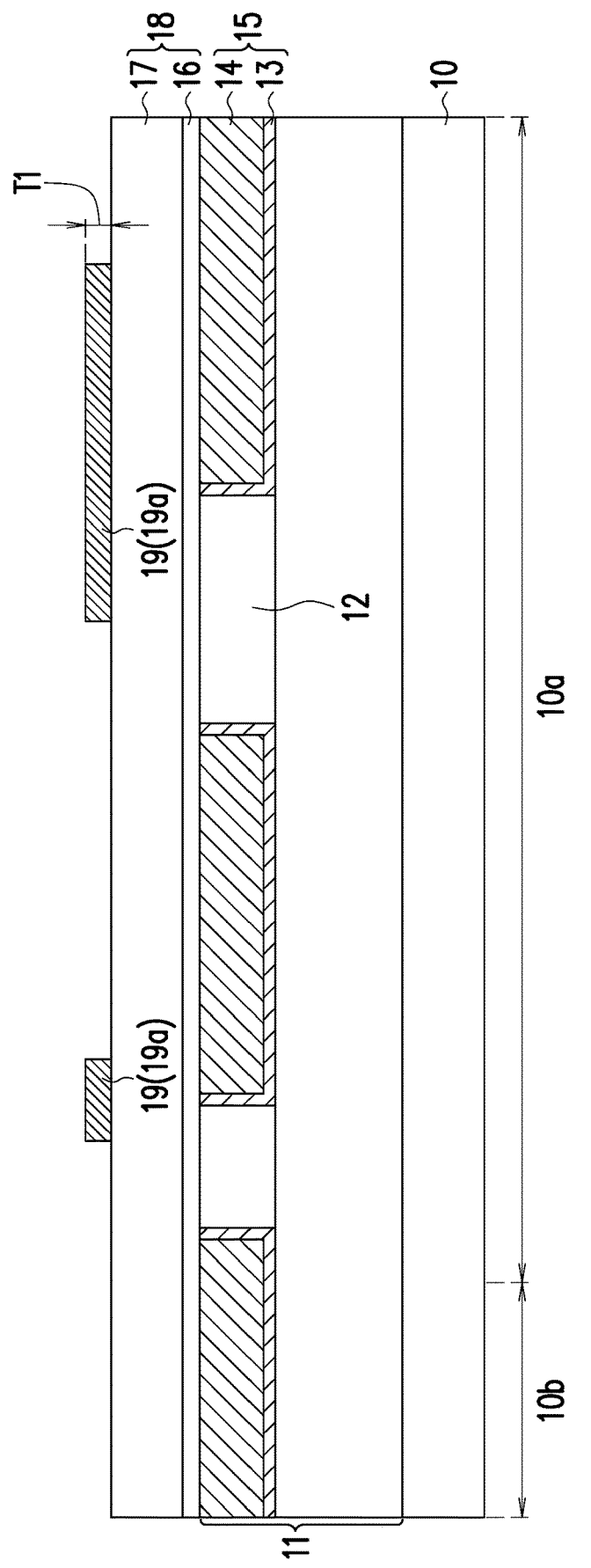
FIG. 1A to FIG. 1J are schematic cross-sectional views illustrating a method of manufacturing a MIM capacitor according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

FIG. 1A to FIG. 1J are schematic cross-sectional views illustrating a method of manufacturing a metal-insulator-metal (MIM) capacitor according to some embodiments of the disclosure.

Referring to FIG. 1A, a substrate 10 is provided. In some embodiments, the substrate 10 is a semiconductor substrate such as a silicon substrate. The substrate 10 is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate 10 may also be formed by other semiconductor materials. The other semiconductor materials include but are not limited to silicon germanium, silicon carbide, gallium arsenide, or the like. The substrate 10 includes active areas and isolation structures (not shown). In some embodiments, the substrate 10 includes a first region 10a and a second region 10b. In some embodiments, the first region 10a is a region on which a capacitor is to be formed. The first region 10a may be a capacitor region. The second region 10b is, for example, a logic region. However, the disclosure is not limited thereto.

In some embodiments, a structure 11 is formed on the substrate 10. The structure 11 includes integrated circuit devices, an inter-layer dielectric (ILD) layer, an interconnect structure, one or more inter-metal dielectric (IMD) layers or/and a dielectric layer 12. For the sake of brevity, only a conductive line 15 of the interconnect structure and the dielectric layer 12 aside the conductive line 15 of the structure 11 are specifically shown, and other components of the structure 11 are not specifically shown in FIG. 1.

In some embodiments, integrated circuit devices are formed on the active areas of the substrate 10. The integrated circuit devices may be active devices, passive devices or a combination thereof. The integrated circuit devices are, for example, transistors, MIM capacitors, resistors, diodes, photodiodes, fuse devices, or other similar devices. The transistors are, for example, metal-oxide-semiconductor field effect transistor (MOSFET) or fin-type field effect transistor (finFET).

The ILD layer may include a single layer or multiple layers, and may include silicon oxide, silicon nitride, silicon oxynitride or a low-k dielectric material. The IMD layer is formed on the ILD layer. The IMD layer may include a single layer or multi layers, and may include a low-k dielectric material, a nitride such as silicon nitride, an oxide such as silicon oxide, tetraethosiloxane (TEOS), high-density plasma (HDP) oxide, plasma-enhanced TEOS (PE-TEOS), spin-on glass (SOG), fluorinated silicate glass (FSG), undoped silicate glass (USG), phosphosilicate glass (PSG), borosilicate glass (BSG), boron-doped phosphosilicate glass (BPSG), a combination thereof or the like.

The interconnect structure is formed in the ILD layer and the IMD layer and connected to different integrated circuit devices to form a functional circuit. In some embodiments, the interconnect structure includes multiple layers of metal lines and plugs. The metal lines and plugs include conductive materials. The plugs include contact plugs and via plugs. The contact plugs are located in the ILD to connect the metal lines to the integrated circuit devices. The via plugs are located in the IMD to be connected to the metal lines in different layers.

In some embodiments, the conductive line 15 is a top metal line of the interconnect structure and is electrically connected to the integrated circuit devices. However, the disclosure is not limited thereto, the conductive line 15 may be any one of the conductive lines of the interconnect structure. In some embodiments, the conductive line 15 includes a barrier layer 13 and a conductive layer 14. The barrier layer 13 may be a single-layer or a multi-layer structure. The material of the barrier layer 13 includes metal, metal nitride, or a combination thereof. The material of the barrier layer 13 is, for example, titanium, titanium nitride, tantalum nitride, or a combination thereof. The conductive layer 14 includes, for instance, copper or other suitable metal. In some embodiments, the bottom surface and the sidewalls of the conductive layer 14 are surrounded and covered by the barrier layer 13. The conductive line 15 is formed in the dielectric layer 12. In other words, the dielectric layer 12 is aside the conductive line 15 to cover the sidewalls of the conductive line 15. The material of the dielectric layer 12 may be the same as or different from the material of the IMD layer. In some embodiments, the dielectric layer 12 may be a portion of the IMD layer. In some embodiments, the top surface of the dielectric layer 12 is substantially coplanar with the top surface of the conductive line 15.

Still referring to FIG. 1A, a dielectric structure 18 is formed on the conductive line 15 and the dielectric layer 12. The dielectric structure 18 includes dielectric materials, such as silicon oxide, tetraethylorthosilicate (TEOS) silicon oxide, silicon nitride, silicon oxynitride, undoped silicon glass (USG), plasma enhanced oxide (PEOX)-USG, borophosphosilicate glass (BPSG), phosphosilicate glass (PSG), a low-k material having a dielectric constant less than 4 or a combination thereof. The low-k material includes fluorine-doped silicon glass (FSG), hydrogen silsesquioxnane (HSQ), methyl silsesquioxane (MSQ), hybrido-organo siloxane polymer (HOSP); aromatic hydrocarbon such as SiLK; parylene; fluoro-polymer such as PFCB, CYTOP, Teflon; organosilicate glass such as black diamond (BD), 3MS, 4MS; poly(arylethers); porous polymer such as XLK, Nanofoam, Awrogel; Coralor or the like.

The dielectric structure 18 may be a single-layer structure or a multi-layer structure. In some embodiments, the dielectric structure 18 is a multi-layer structure and includes a first dielectric layer 16 and a second dielectric layer 17. The material of the first dielectric layer 16 and the material of the second dielectric layer 17 may be the same or different. In some embodiments, the first dielectric layer 16 and the second dielectric layer 17 includes different materials, and the first dielectric layer 16 may serve as an etching stop layer in subsequent processes. The method of forming the first dielectric layer 16 and the second dielectric layer 17 includes chemical vapor deposition (CVD) process or spin-coating process. In some embodiments, the first dielectric layer 16 includes silicon nitride or silicon oxynitride, and the second dielectric layer 17 includes oxide such as silicon oxide or USG.

Still referring to FIG. 1A, a first conductive layer 19 is formed on the dielectric structure 18. The first conductive layer 19 may be a single-layer structure or a multi-layer structure. The first conductive layer 19 may include various conductive materials, such as a metal, a metal alloy, a metal nitride, a metal silicide, a metal oxide, graphene or a combination thereof. For example, the first conductive layer 19 may include aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or a combination thereof.

In some embodiments, the first conductive layer 19 includes a plurality of first conductive patterns 19a spaced from each other on the top surface of the dielectric structure 18. The first conductive layer 19 may be formed by the following processes: a conductive material layer (not shown) is at first formed on the dielectric structure 18 by a suitable technique such as a physical vapor deposition (PVD) process. Thereafter, the conductive material layer is patterned by photolithography and etching processes to form the first conductive patterns 19a. In some embodiments, the thickness T1 of the first conductive layer 19 may be in a range of 300 Å to 500 Å. In an embodiment, the thickness T1 is 400 Å. However, the disclosure is not limited thereto.

In some embodiments, the cross-section shape of the first conductive pattern 19a is square, rectangle, trapezoid, or the like. The sidewall of the first conductive pattern 19a may be straight, arced or inclined. In some embodiments, the first conductive patterns 19a are also referred as a first electrode 19a.

Figure 1B:
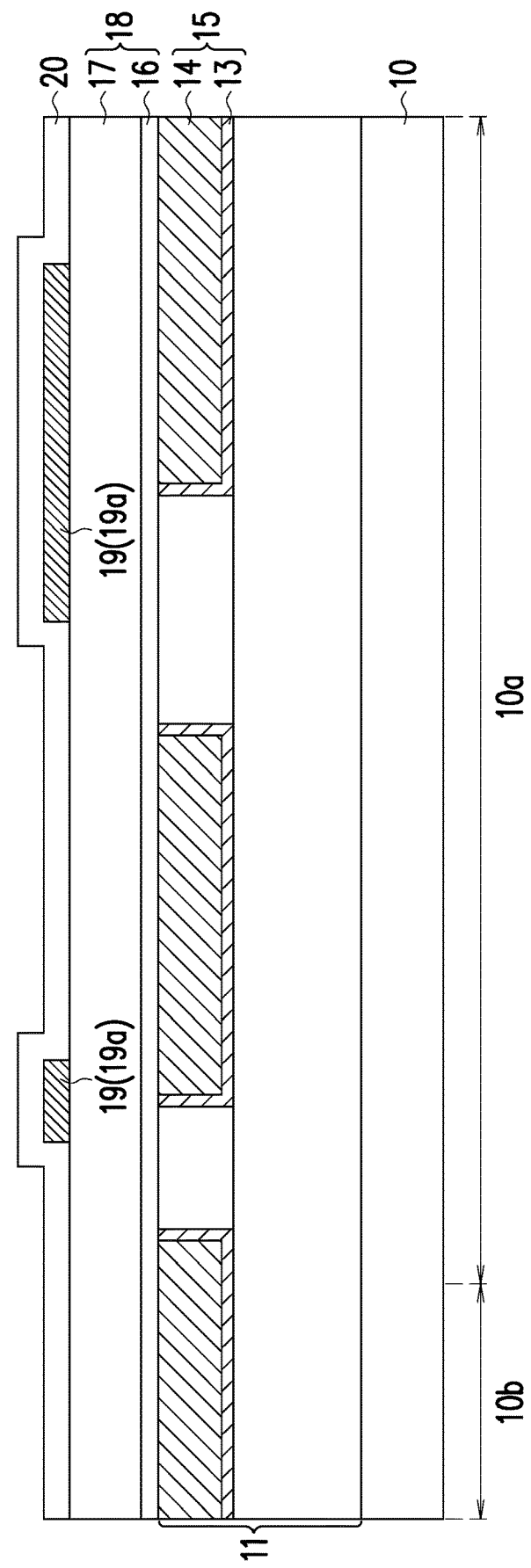

Referring to FIG. 1B, a spacer material layer 20 is formed on the first conductive layer 19 and the dielectric structure 18. In some embodiments, the spacer material layer 20 is a single-layer structure and comprises a dielectric material. In some other embodiments, the spacer material layer 20 is a multi-layer structure and may comprise a dielectric material, a conductive material or a combination thereof. The multi-layer structure may include a dielectric layer and a conductive layer formed sequentially. In some embodiments, the spacer material layer 20 includes oxide such as silicon oxide, nitride such as silicon nitride, oxynitride such as silicon oxynitride, oxide-nitride-oxide (ONO) structure, TiN, or a combination thereof. The spacer material layer 20 may be formed by a CVD process, PVD process, spin coating process or the like.

Figure 1C:
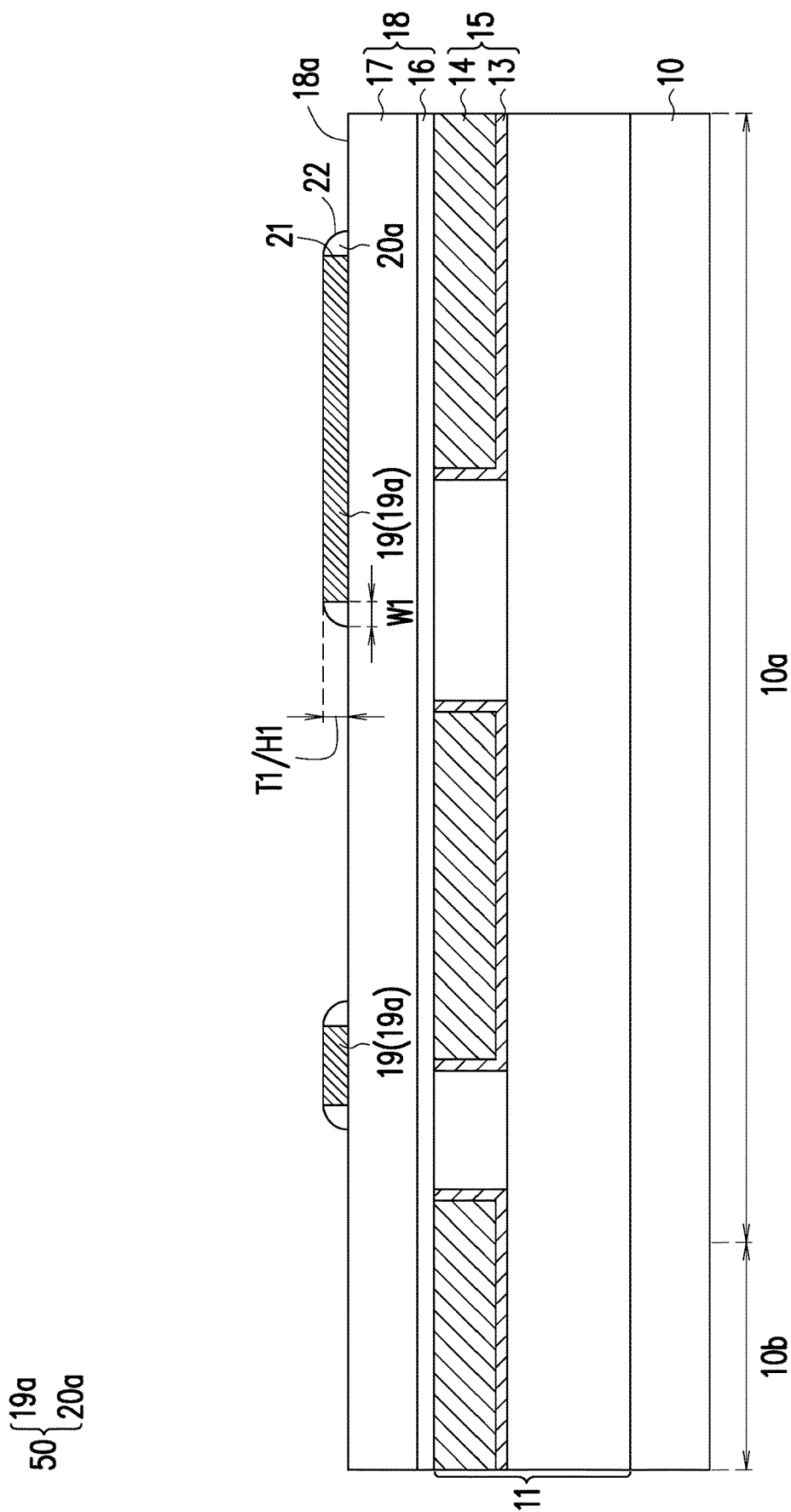

Referring to FIG. 1B and FIG. 1C, an etching process such as an anisotropic etching process is performed on the spacer material layer 20 to form spacers 20a on sidewalls of the first conductive layer 19. In some embodiments in which the spacer material layer 20 is a multi-layer structure including a dielectric layer and a conductive layer, the dielectric layer serves as an etching stop layer during the etching process.

The spacer 20a covers the sidewall of the first conductive layer 19 and a portion of the top surface 18a of the dielectric structure 18. The cross-section shape of the spacer 20a may be fan-shaped, triangle, or the like of a combination thereof. The sidewall 22 of the spacer 20a may be arced, inclined or curved. In some embodiments, the slope of the sidewall 22 is very gentle. In some embodiments, the sidewall 22 of the spacer 20a includes non-single slope. For example, the slope of the sidewall 22 of the spacer 20a changes gradually from top to bottom, such as gradually increased from top to bottom. In some embodiments, the base angle of the spacer 20a is less than the base angle of the first conductive layer 19. In some embodiments, the height H1 of the spacer 20a is equal to or less than the thickness T1 of the first electrode 19a, and ranges from 300 Å to 500 Å. The width W1 of the spacer 20a ranges from 200 Å to 400 Å, for example.

In some embodiments, the first electrode 19a and the spacers 20a on sidewalls of the first electrode 19a form a first electrode structure 50. However, the disclosure is not limited thereto. The spacers 20a may be optionally formed. That is to say, in some other embodiments, the first electrode structure 50 may just include the first electrode 19a, and no spacer is formed on sidewalls of the first electrode 19a. The embodiment in which no spacer is formed on sidewalls of the first electrode is shown in FIG. 2B and will be described below.

Figure 1D:
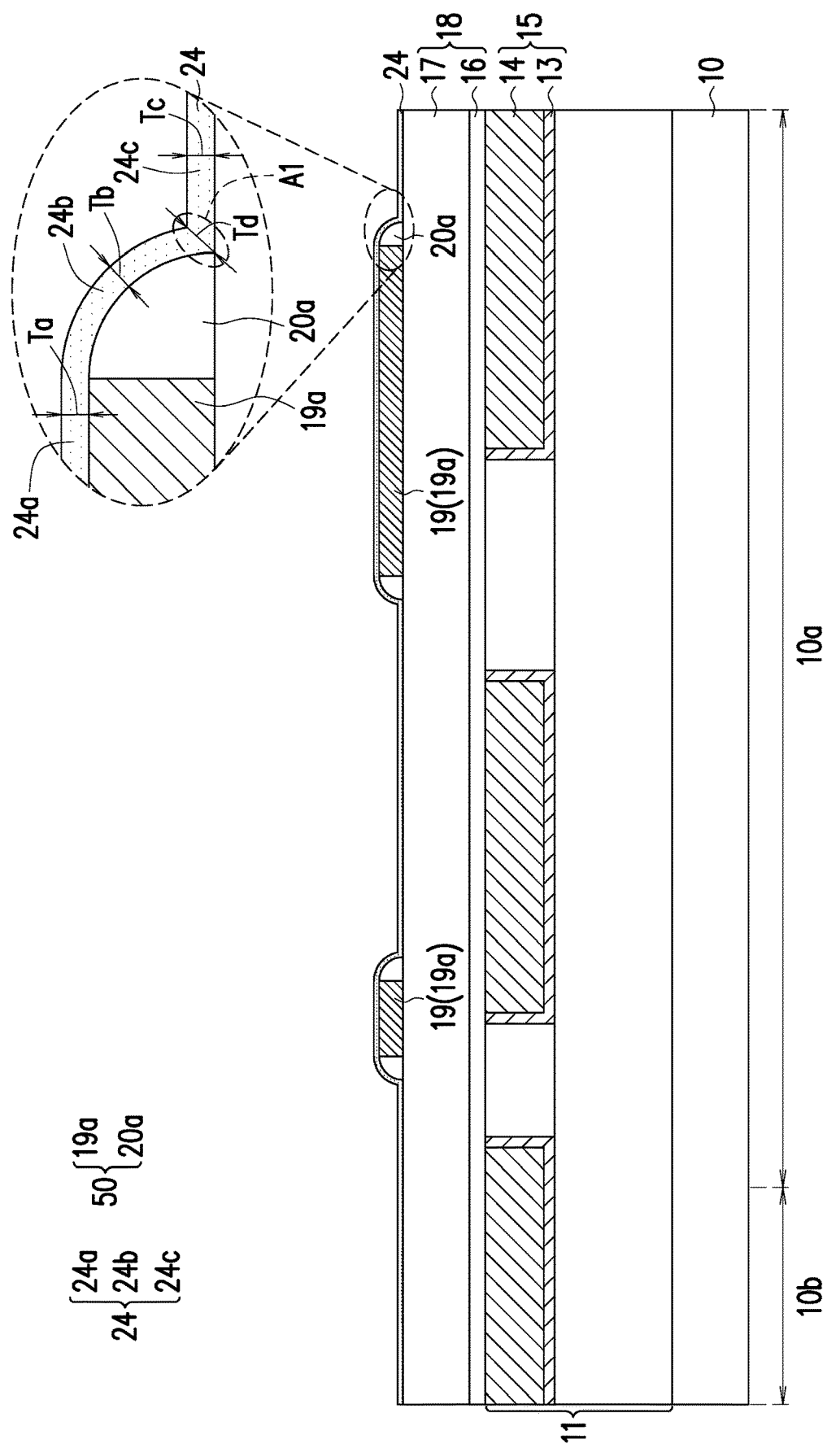

Referring to FIG. 1D, a first insulating layer 24 (also referred as a dielectric layer) is formed on the first conductive layer 19, the spacers 20a and the dielectric structure 18 by, for example, a CVD process, spin coating process, an atomic layer deposition (ALD) process. The first insulating layer 24 includes oxide, nitride, oxynitride, a high-k dielectric material or a combination thereof. The first insulating layer 24 includes, for example, silicon oxide, silicon nitride, silicon oxynitride, an oxide-nitride-oxide (ONO) structure, a high-k dielectric material having a dielectric constant greater than that of silicon oxide, or a combination thereof. In some embodiments, the dielectric constant of the high-k dielectric material is greater than 4, greater than 7 or even greater than 10. The high-k dielectric material may include hafnium oxide (HfO2), hafnium silicate ($HfSiO_4$), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), titanium oxide ($TiO_2$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT) or a combination thereof. In some embodiments, the thickness of the first insulating layer 24 ranges from 50 Å to 100 Å. In an embodiment, the thickness of the first insulating layer 24 is 60 Å.

The first insulating layer 24 may be a single-layer structure or a multi-layer structure. In some embodiments, the first insulating layer 24 is a three-layer structure consisting of $ZrO_2$, $Al_2O_3$ and $ZrO_2$ sequentially, and the thickness of each layer of the three-layer structure may be the same or different. In an embodiment, the thickness of each layer of the three-layer structure is 20 Å.

In some embodiments, the first insulating layer 24 is conformal with the first electrode structure 50 and the dielectric structure 18. As spacers 20a are formed on the sidewalls of the first electrode 19a, the corner thinning issue of the first insulating layer 24 is avoided, and the first insulating layer 24 has a uniform thickness extending on the surface of the first electrode structure 50 and the dielectric structure 18. In other words, the first insulating layer 24 includes a first portion 24a on the top surface of first electrode 19a, a second portion 24b on sidewalls of the spacer 20a and a third portion 24c on the top surface of the dielectric structure 18. The thickness Ta of the first portion 24a and the thickness Tc of the third portion 24c are substantially the same as each other. Further, the thickness Tb of the second portion 24b and the thickness Td of the corner A1 of the first insulating layer 24 are substantially the same as the thickness Ta or Tb. The corner A1 refers to the portion of the first insulating layer 24 on the corner between the spacer 20a and the top surface of the dielectric structure 18. In some embodiments, the thickness difference between the thickness Tb and the thickness Ta/Tc ranges from 0 to 10 Å, for example. The thickness difference between the thickness Td and the thickness Ta/Tc ranges from 0 to 10 Å, for example.

Figure 1E:
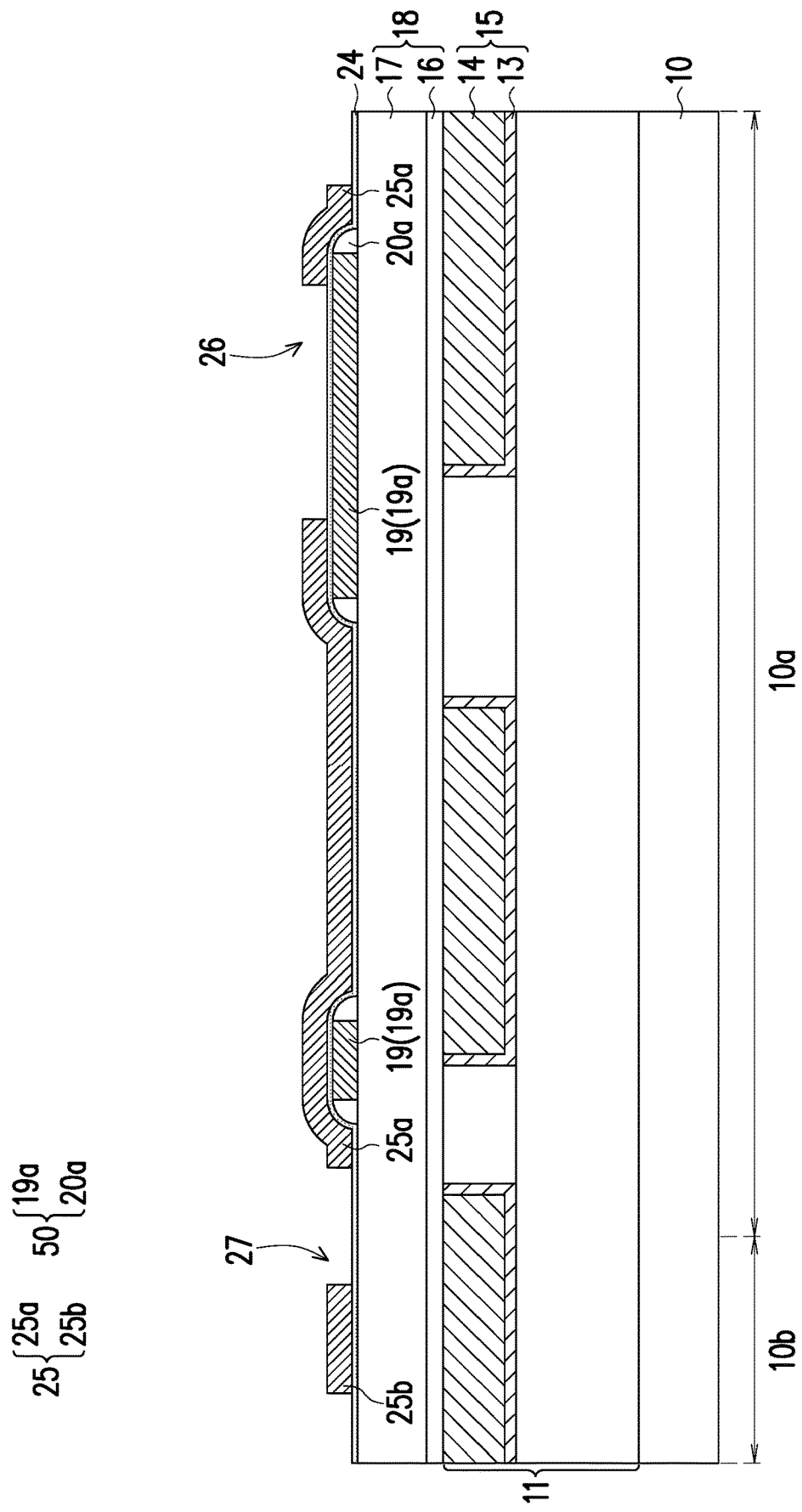

Referring to FIG. 1E, a second conductive layer 25 is formed on the first insulating layer 24. In some embodiments, the second conductive layer 25 is conformal with the first insulating layer 24. The material and the forming method of the second conductive layer 25 are similar to those of the first conductive layer 19, which is not described again. The thickness and the material of the second conductive layer 25 may be the same as or different from those of the first conductive layer 19, respectively.

In some embodiments, the second conductive layer 25 includes second conductive patterns 25a and one or more second conductive patterns 25b. The second conductive patterns 25a and second conductive patterns 25b are electrically separated from each other. In some embodiments, the second conductive patterns 25a are referred as a second electrode, and are formed on the first region 10a of the substrate 10. In some embodiments, the second conductive patterns 25a include a step structure. In other words, a portion of the second conductive pattern 25a is located on the first conductive pattern 19a, and other portion of the second conductive pattern 25a is located at sides of the conductive pattern 19a. The second conductive patterns 25b are formed on the second region 10b of the substrate 10 and disconnected to the first conductive patterns 25a.

In some embodiments, an opening 26 is formed between the second conductive patterns 25a and over the first conductive pattern 19a. The opening 26 exposes a portion of the top surface of the first insulating layer 24 on the first conductive pattern 19a. An opening 27 is formed between the second conductive pattern 25a and the second conductive pattern 25b. The opening 27 exposes a portion of the top surface of the first insulating layer 24 on the dielectric structure 18.

Figure 1F:
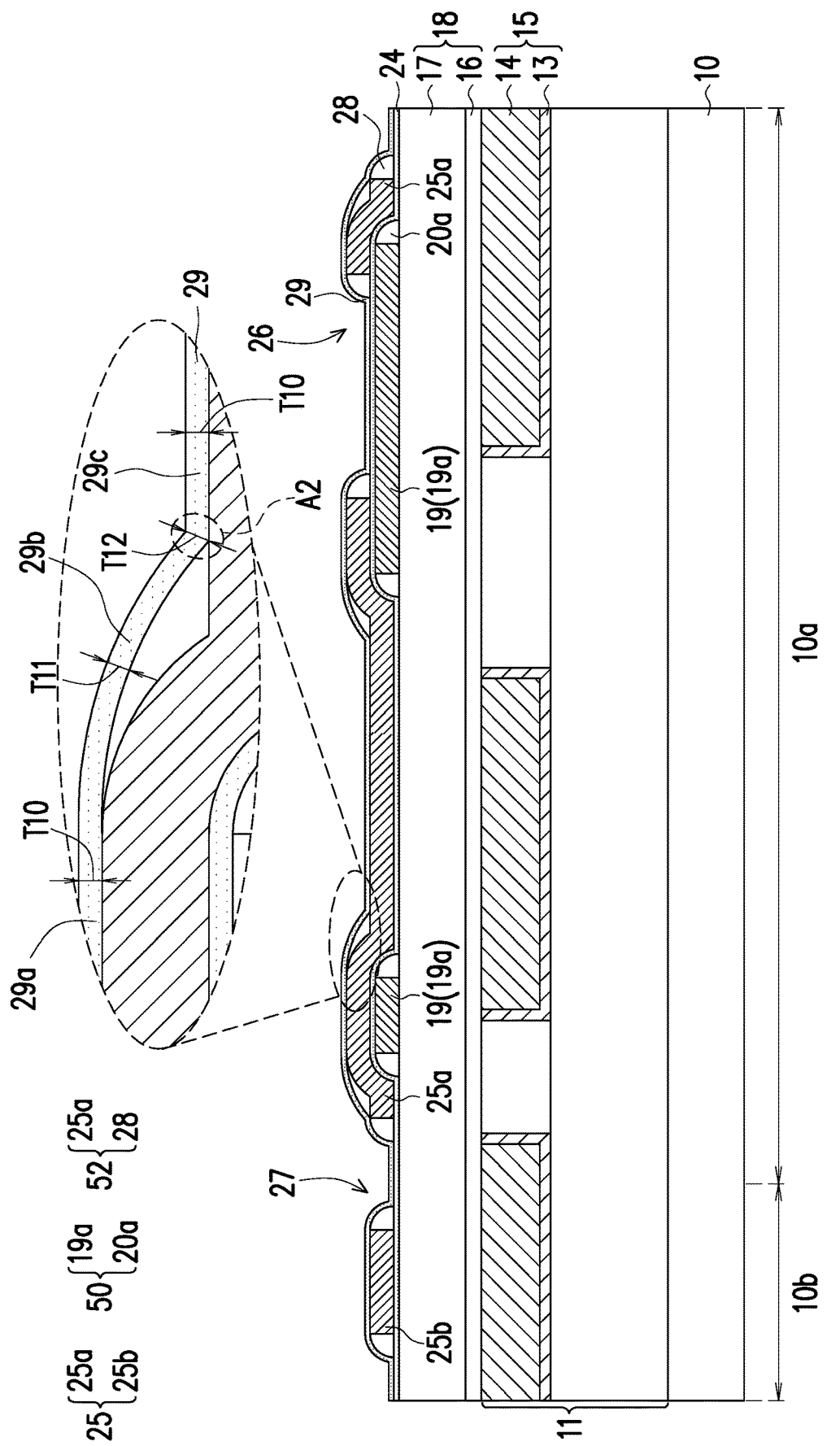

Referring to FIG. 1F, processes similar to those of FIG. 1B to FIG. 1D are performed, so as to form spacers 28 on sidewalls of the second conductive layer 25, and a second insulating layer 29 is then formed over the substrate 10. The second insulating layer 29 conformally covers the second conductive layer 25, the spacers 28 and the first insulating layer 24. Herein, the word "conformally" means the second insulating layer 29 has a uniform thickness extending on the second conductive layer 25, the spacers 28 and the first insulating layer 24. Similar to the first insulating layer 24, the second insulating layer 29 has a first portion 29a, a second portion 29b and a third portion 29c connected to each other. The first portion 29a and the third portion 29c are extending along a direction parallel to the top surface of the substrate 10 and have the same thickness T10. The second portion 29b is on the sidewalls of the spacers 28 and between the first portion 29a and the third portion 29c. The thickness T11 of the second portion 29b is substantially the same as the thickness T10 of the first portion 29a or the third portion 29c. Further, the thickness T12 of the corner A2 of the second insulating layer 29 is substantially the same as the thickness T10. Herein, the corner A2 of the second insulating layer 29 refers to the portion of the second insulating layer 29 on the corner between the spacer 28 and the second conductive layer 25, or the corner between the spacer 28 and the first insulating layer 24, or the corner between the spacers 28. In some embodiments, the thickness difference between the thickness T11 and the thickness T10 ranges from 0 to 10 Å, for example. The thickness difference between the thickness T12 and the thickness T10 ranges from 0 to 10 Å, for example.

In some embodiments, the second electrode 25a and the spacers 28 on sidewalls of the second electrode 25a form a second electrode structure 52. The second electrode structure 52 is stacked on the first electrode structure 50, and is electrically isolated from the first electrode structure 50 by the first insulating layer 24 therebetween.

Figure 1G:
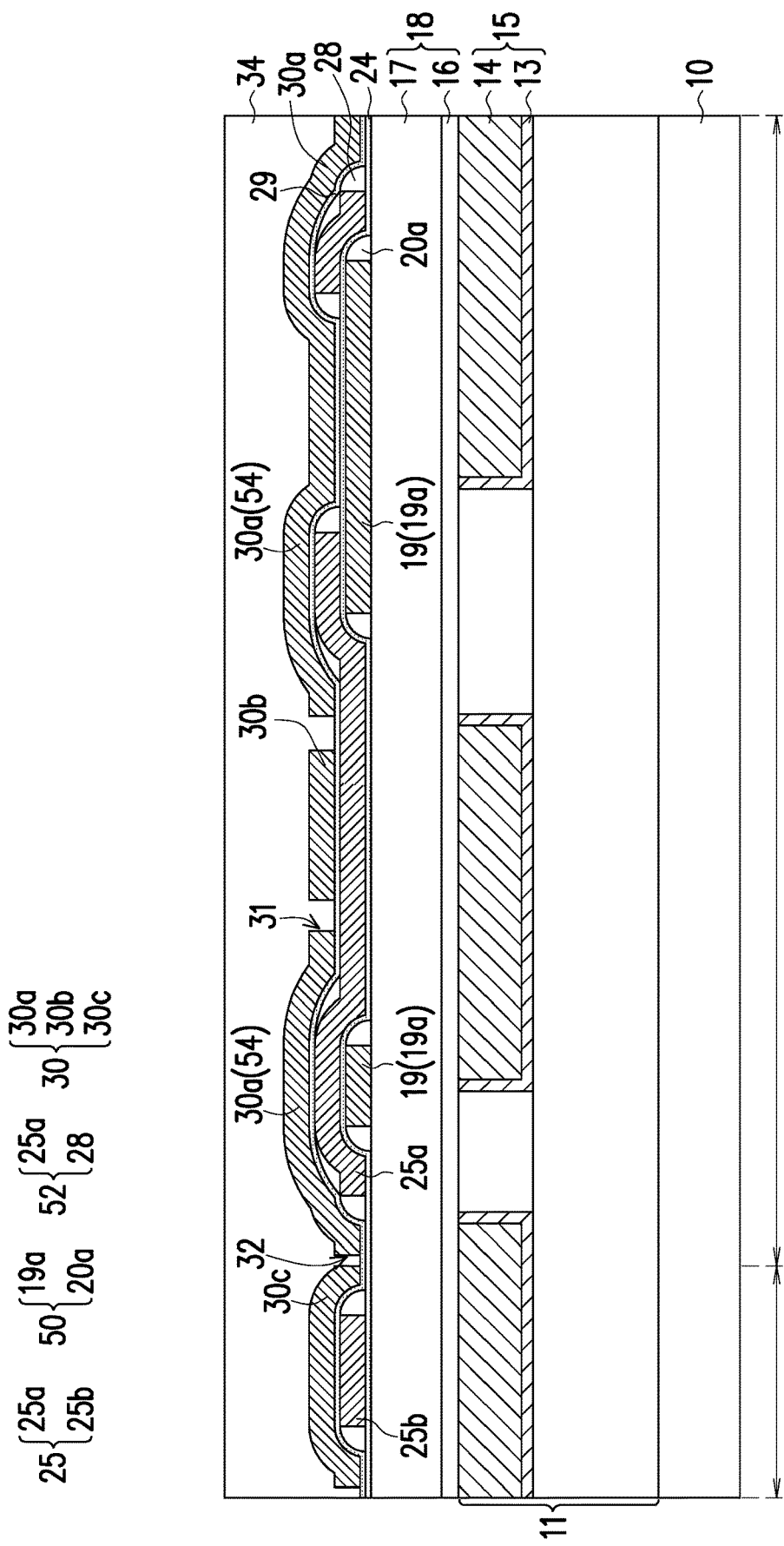

Referring to FIG. 1G, a third conductive layer 30 is formed on the second insulating layer 29. The material and the forming method of the third conductive layer 30 are similar to those of the second conductive layer 25, which is not described again.

In some embodiments, the third conductive layer 30 includes third conductive patterns 30a, 30b and 30c. The third conductive patterns 30a and 30b are formed on the first region 10a of the substrate 10, and the third conductive pattern 30c is formed on the second region 10b of substrate 10. The third conductive patterns 30a are referred as a third electrode. The third conductive pattern 30b is located between and separated from the third conductive patterns 30a, and serve as a dummy pattern in subsequent processes.

Openings 31 are formed between the third conductive pattern 30a and the third conductive pattern 30b. In some embodiments, the openings 31 penetrates through the third conductive layer 30 and expose a portion of the top surface of the second insulating layer 29 on the second electrode 25a. An opening 32 is formed between the third conductive pattern 30a and the third conductive pattern 30c. The opening 32 penetrates through the third conductive layer 30 and exposes a portion of the top surface of the second insulating layer 29 on the first insulating layer 24.

In some embodiments, the third electrode 30a is also referred as a third electrode structure 54. The third electrode structure 30a is stacked on the second electrode structure 52, and is electrically isolated from the second electrode structure 52 by the second insulating layer 29 therebetween.

Sill referring to FIG. 1G, a dielectric layer 34 is formed on the third conductive layer 30. The dielectric layer 34 covers the surface of the third conductive layer 30 and fills into the openings 31 and 32. The material of the dielectric layer 34 is similar to the material of the dielectric layer 12 or the material of the dielectric structure 18, which is not described again. The material of the dielectric layer 34 may be the same as or different from the material of the dielectric layer 12 or the material of the dielectric structure 18.

Figure 1H:
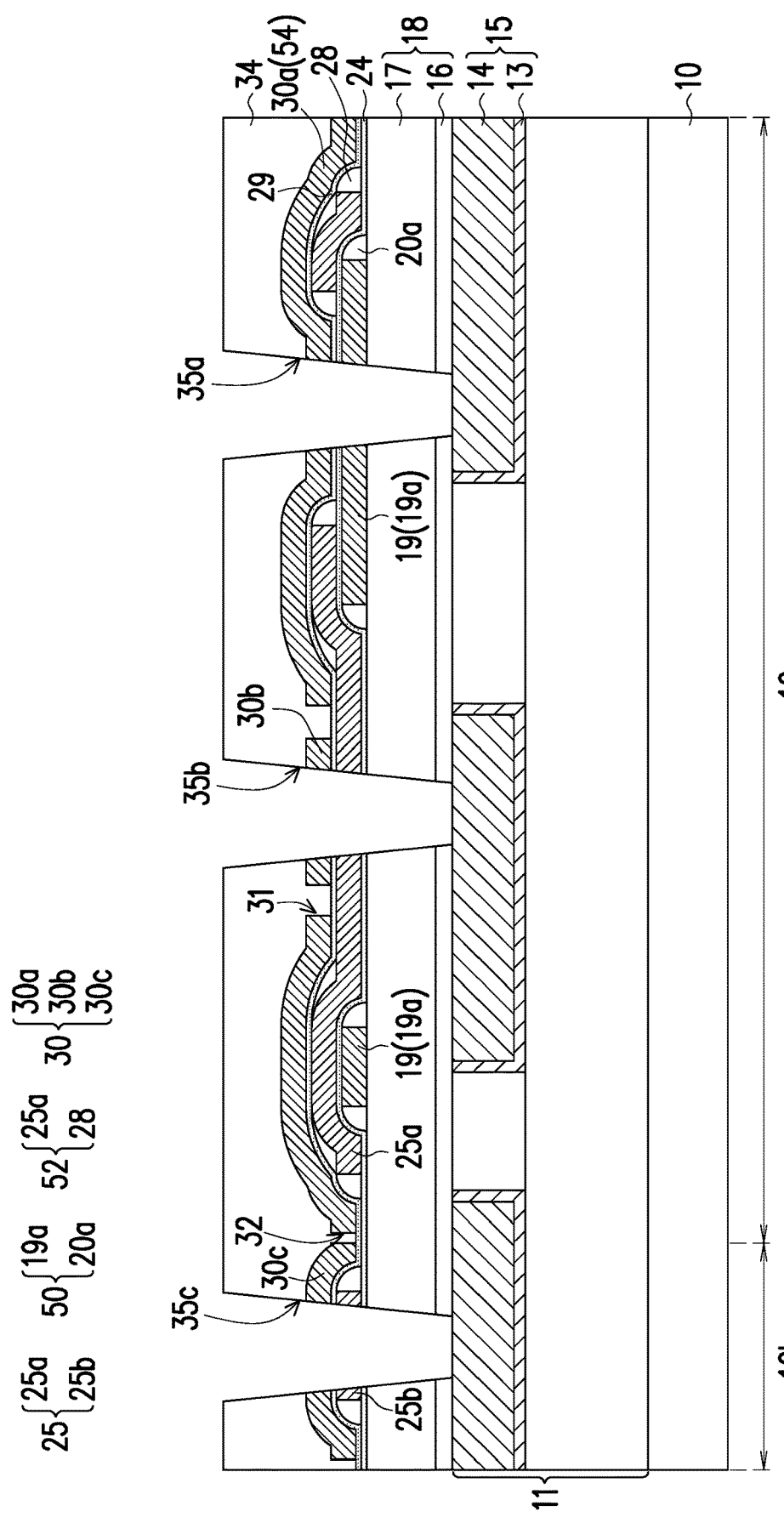

Referring to FIG. 1G and FIG. 1H, the dielectric layer 34, the third conductive layer 30, the second insulating layer 29, the second conductive layer 25, the first insulating layer 24, the first conductive layer 19 and the dielectric structure 18 are patterned by a patterning process, so as to form a plurality of contact holes 35a, 35b and 35c exposing portions of top surfaces of the conductive line 15. The patterning process includes photolithography and one or more etching processes, for example. During the etching process, the first dielectric layer 16 of the dielectric structure 18 may serve as an etching stop layer, after the etching process is performed until the first dielectric layer 16 is exposed, the etching process is further performed to remove the dielectric layer 16 to expose the top surface of the conductive line 15.

The contact hole 35a penetrates through the dielectric layer 34, the third electrode 30a, the second insulating layer 29, the first insulating layer 24, the first electrode 19a and the dielectric structure 18. The bottom of the contact hole 35a exposes the top surface of the conductive line 15.

The contact hole 35b penetrates through the dielectric layer 34, the dummy pattern 30b, the second insulating layer 29, the second electrode 25a, the first insulating layer 24, and the dielectric structure 18. The bottom of the contact hole 35b exposes the top surface of the conductive line 15. In some embodiments, the contact hole 35b is located between the openings 31.

The contact hole 35c penetrates through the dielectric layer 34, the third conductive pattern 30c, the second insulating layer 29, the second conductive pattern 25b, the first insulating layer 24, and the dielectric structure 18. The bottom of the contact hole 35c exposes the top surface of the conductive line 15.

During the etching processes, as the dummy pattern 30b (which is electrically isolated from the third electrode 30a) is provided, the number of the conductive layers need to be etched for forming the contact holes 35a, 35b and 35c are substantially the same, further, the number of the dielectric or insulating layers need to be etched for forming the contact holes 35a, 35b and 35c are also the same. That is to say, the etching environment for forming the contact holes 35a, 35b and 35c are substantially the same as each other, therefore, the issue of loading effect is thus avoided.

Figure 1I:
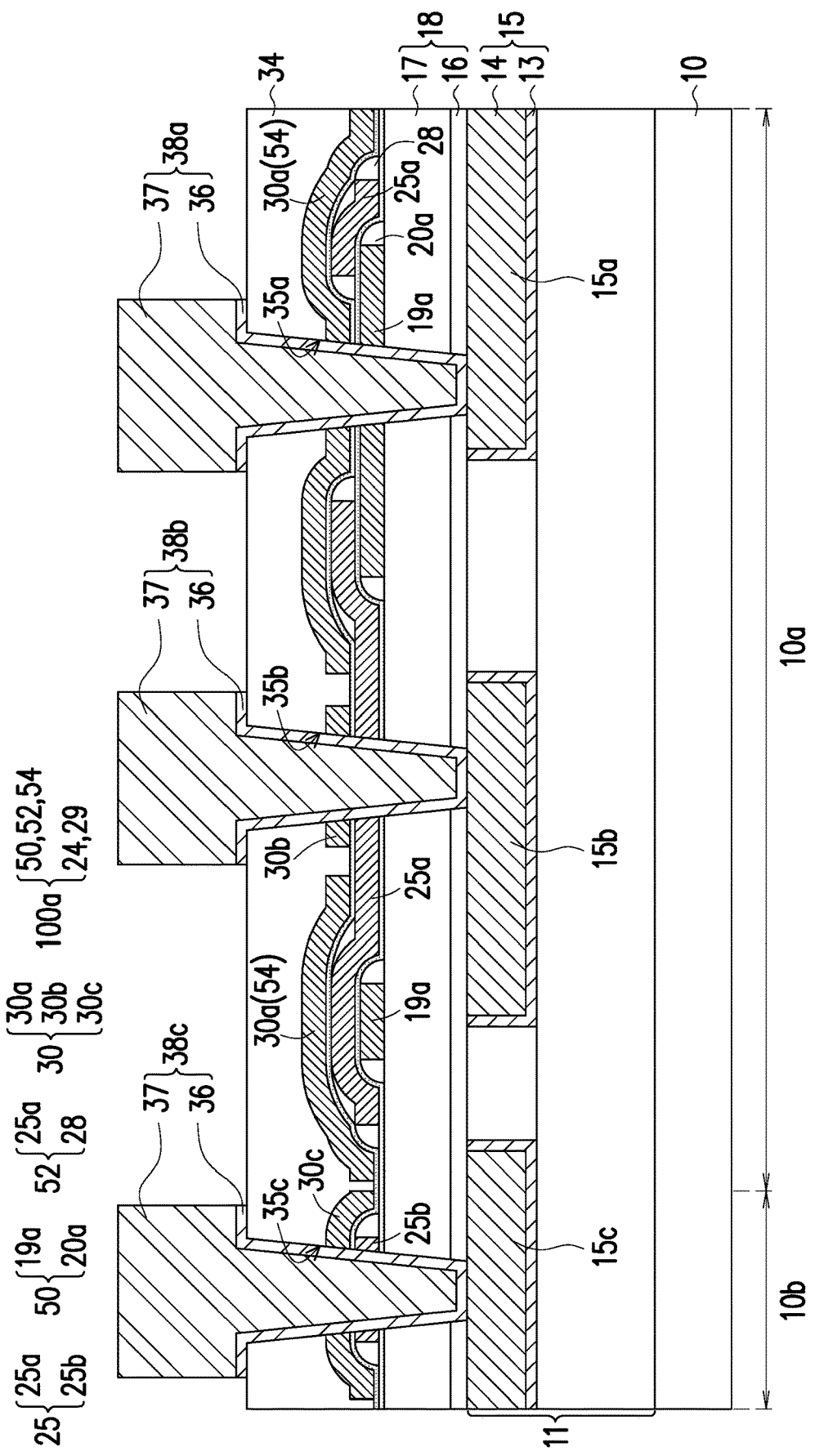

Referring to FIG. 1I, a plurality of contacts 38a, 38b and 38c are formed on the conductive line 15. The contacts 38a, 38b and 38c fill in the contact holes 35a, 35b, 35c and cover a portion of the top surface of the dielectric layer 34, respectively. In some embodiments, the contacts 38a, 38b and 38c respectively include a barrier layer 36 and a conductive layer 37. The materials of the barrier layer 36 and the conductive layer 37 are respectively similar to those of the barrier layer 13 and the conductive layer 14, which are not described again. In some embodiments, the materials of the barrier layer 36 and the conductive layer 37 are respectively the same as or different from those of the barrier layer 13 and the conductive layer 14. The barrier layer 36 and the conductive layer 37 may be formed by the following processes: a barrier material layer (not shown) and a conductive material layer (not shown) are sequentially formed on the dielectric layer 34 by, for example, a PVD process, the barrier material layer and the conductive material layer cover the top surface of the dielectric layer 34, and fill into the contact holes 35a, 35b and 35c. Thereafter, the barrier material layer and the conductive material layer are patterned by photolithography and etching processes.

In some embodiments, the conductive line 15 includes the conductive lines 15a, 15b and 15c. The contact 38a is in electrical contact with the conductive line 15a, the first electrode 19a and the third electrode 30a. The contact 38b is in electrical contact with the conductive line 15b and the second electrode 25a. The contact 38c is in electrical contact with the conductive line 15c, the second conductive pattern 25b and the third conductive pattern 30c. The conductive line 15a and the conductive line 15b are electrically isolated from each other. In some embodiments, the conductive line 15c is electrically isolated from the conductive line 15a or 15b, but the disclosure is not limited thereto.

Referring to FIG. 1I, a MIM capacitor 100a is thus completed. In some embodiments, the MIM capacitor 100a includes the first electrode structure 50, the second electrode structure 52, the third electrode structure 54, the first insulating layer 24, the second insulating layer 29, and the contacts 38a and 38b. The first electrode structure 50 includes the first electrode 19a and spacers 20a on sidewalls of the first electrode 19a. The second electrode structure 52 includes the second electrode 25a and the spacers 28 on sidewalls of the second electrode 25a. The third electrode structure 54 includes the third electrode 30a. In some embodiments, the materials and the thicknesses of the first electrode structure 50, the second electrode structure 52 and the third electrode structure 54 may be the same or different. The materials and the thicknesses of the first insulating layer 24 and the second insulating layer 29 may be the same or different.

The contact 38a penetrates through the third electrode 30a and the first electrode 19a to connect to the conductive line 15. That is to say, the third electrode 30a and the first electrode 19a are electrically connected to the conductive line 15 through the contact 38a.

The contact 38b penetrates through the third conductive pattern 30b and the second electrode 25a to connect to the conductive line 15. Because the third conductive pattern 30b is a dummy pattern which is electrically isolated from the third electrode 30a, therefore, the contact 38b is electrically isolated from the third electrode 30a. In other words, the second electrode 25a is electrically connected to the conductive line 15 through the contact 38b.

In some embodiments, the contact 38a connecting the first electrode 19a to the third electrode 30a, and the contact 38b connecting the second electrode 25a are respectively connected to the conductive lines 15a and 15b at the same side of the dielectric structure 18, but the disclosure is not limited thereto. In some other embodiments, the contact 38a and the contact 38b may be connected to conductive lines at different sides of the dielectric structure 18.

The contact 38c penetrates through the third conductive pattern 30c and the second conductive pattern 25b to electrically connect to the conductive line 15c. The third conductive pattern 30c and the second conductive pattern 25b are electrically connected to the conductive line 15 through the contact 38c. In some embodiments, the contact 38c, third conductive pattern 30c and the second conductive pattern 25b are components formed on a logical region 10b of the substrate 10, and are separated from the MIM capacitor 100a.

Figure 1J:
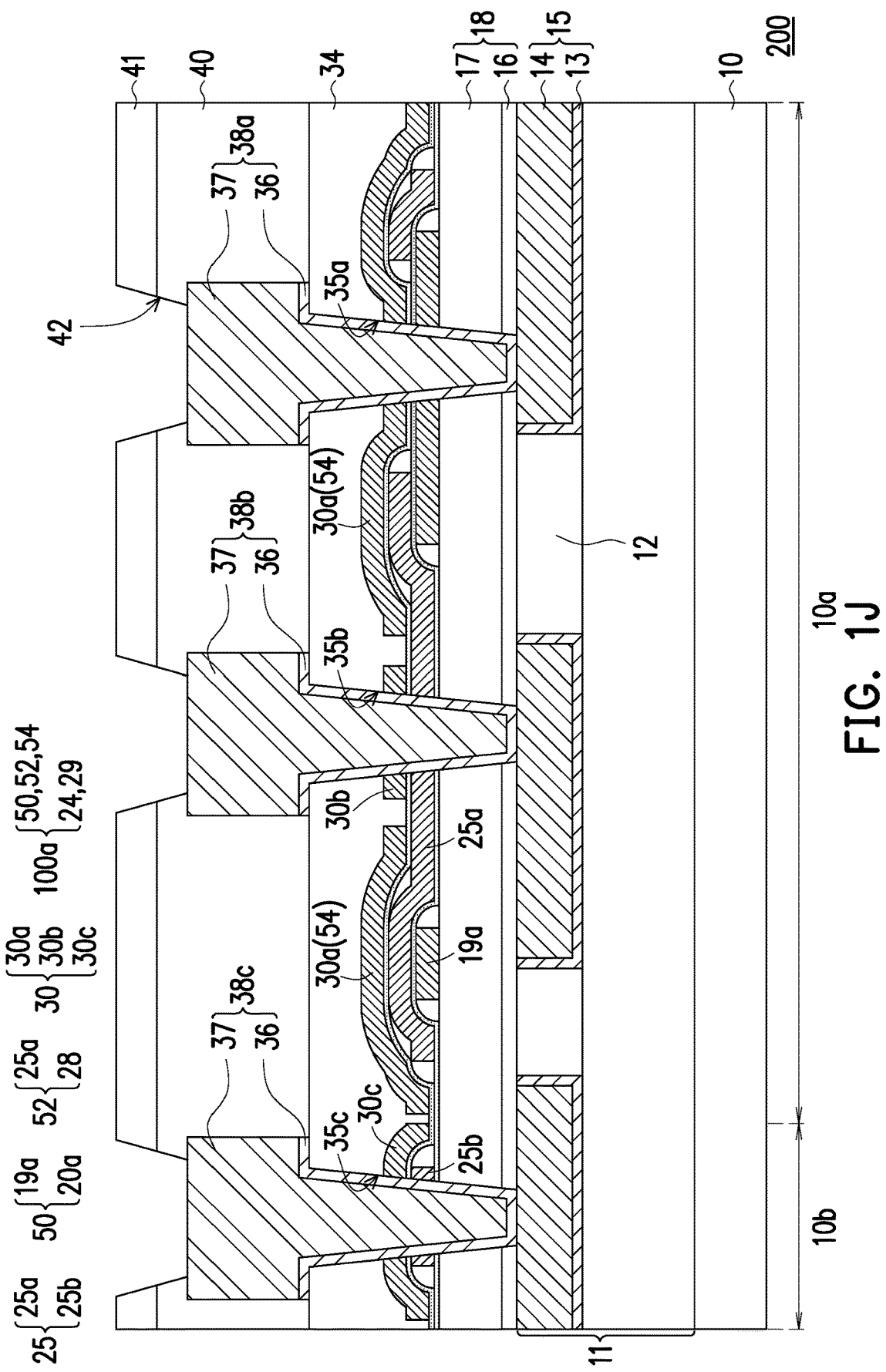

Referring to FIG. 1J, in some embodiments in which the conductive line 15 is a top metal line of the interconnect structure, a passivation layer 40 and a protection layer 41 are formed on the dielectric layer 34 and the contacts 38a, 38b and 38c. The material of the passivation layer 40 includes a dielectric material such as silicon oxide, or a polymer. The material of the protection layer 41 includes a dielectric material such as silicon nitride or a polymer. In some embodiments, the material of the protection layer 41 is different from the material of the passivation layer 40. The passivation layer 40 and the protection layer 41 may be formed by CVD processes.

A plurality of pad window 42 are formed in the passivation layer 40 and the protection layer 41, so as to expose portions of the top surfaces of the contacts 38a, 38b and 38c.

Still referring to FIG. 1J, a semiconductor device 200 is thus completed. The semiconductor device 200 includes the substrate 10, the structure 11 including the conductive line 15 and the dielectric layer 12, the MIM capacitor 100a, the passivation layer 40 and the protection layer 41. In some embodiments, subsequent processes such as packing processes may be performed on the semiconductor device 200, and the contacts 38a, 38b and 38c may serve as external connections of the semiconductor device 200. In this embodiment, the MIM capacitor 100a is integrated in the semiconductor device 200, but the disclosure is not limited thereto.

Figure 2A:
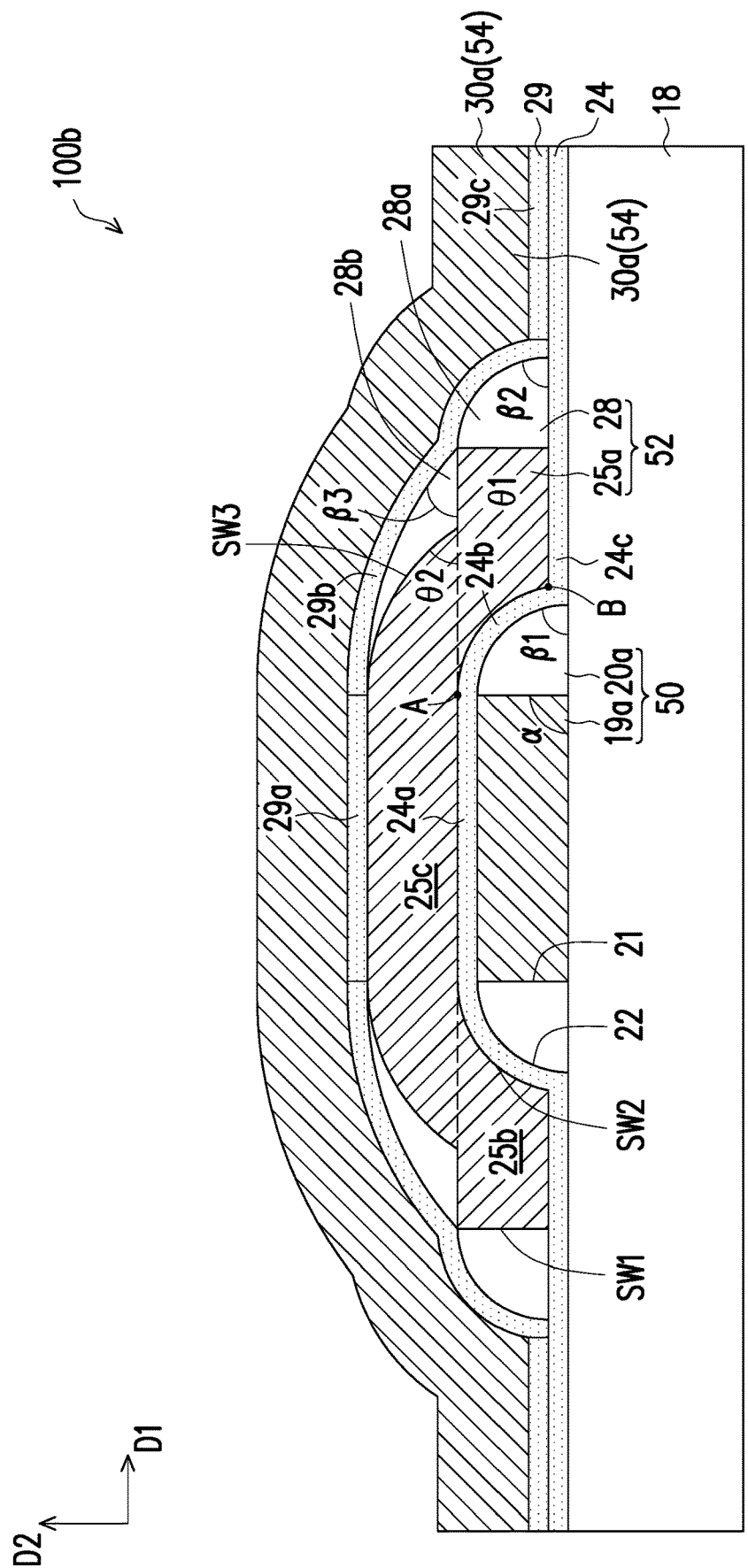
FIG. 2A to FIG. 2C are schematic cross-sectional views respectively illustrating an enlarged view of a MIM capacitor according to some embodiments of the disclosure.
Figure 2B:
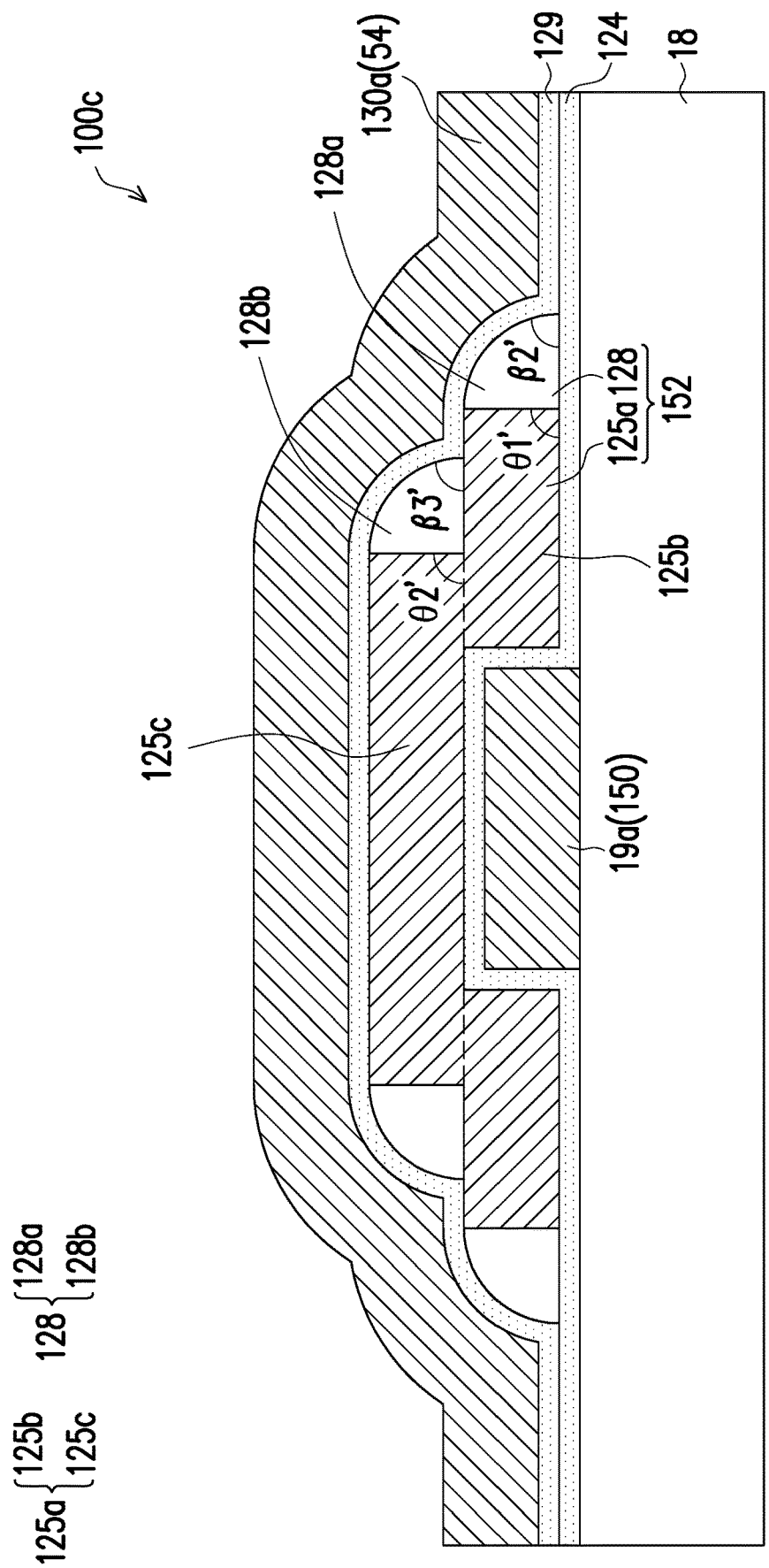

FIG. 2A is an enlarged view of a MIM capacitor according to some embodiments of the disclosure. The MIM capacitor shown in FIG. 2A is similar to the MIM capacitor 100a, but may be in different cross-section from that of the MIM capacitor 100a as shown in FIG. 1J. For the sake of brevity, FIG. 2A merely illustrate the dielectric structure 18 underlying the MIM capacitor, the first electrode structure 50, the second electrode structure 52, the third electrode structure 54, the first insulating layer 24 and the second insulating layer 29.

Referring to FIG. 2A, the MIM capacitor 100b is located on the dielectric structure 18. The MIM capacitor 100b includes a first electrode structure 50, a first insulating layer 24, a second electrode structure 52, a second insulating layer 29 and a third electrode structure 54 stacked from bottom to top. The first insulating layer 24 is located between and electrically isolates the first electrode structure 50 and the second electrode structure 52. The second insulating layer 29 is located between and electrically isolates the second electrode structure 52 and the third electrode structure 54. In some embodiments, the first electrode structure 50 and the third electrode structure 54 are electrically connected to each other through a contact 38a, and the second electrode structure 52 is electrically connected to a contact 38b (shown in FIG. 1J).

In some embodiments, the first electrode structure 50 includes a first electrode 19a and spacers 20a on sidewalls of the first electrode 19a. In some embodiments, the cross-section shape of the first electrode 19a is square, rectangle, trapezoid, or the like. The sidewalls 21 of the first electrode 19a may be straight, arced or inclined, and the opposite sidewalls 21 of the first electrode 19a may be symmetric or asymmetric to each other. In other word, the first conductive pattern 19a includes base angles α, herein, the base angle α refers to the included angle between the sidewall 21 and the bottom surface of the first electrode 19a. The base angle α is a right angle or an acute angle. In some embodiments, the base angles α range from 70° to 90°. The base angles α between opposite sidewalls and the bottom surface of the first electrode 19a may be the same as or different from each other.

The spacer 20a is located on and covers the sidewalls 21 of the first electrode 19a. In some embodiments, the bottom surface of the spacer 20a is substantially coplanar with the bottom surface of the first electrode 19a. The cross-section shape of the spacer 20a may be fan-shaped, triangle, or the like or a combination thereof. The sidewall 22 of the spacer 20a may be arced, inclined or curved. The sidewall 22 may include non-single slope or a very gentle slope. The slope of the sidewall 22 of the spacer 20a may change gradually from top to bottom, such as increased gradually from top to bottom. In some embodiments, the base angle β1 of the spacer 20a is less than the base angle α of the first conductive layer 19. The base angle β1 of the spacer 20a (that is, the base angle of the first electrode structure 50) ranges from 45° to 60°, for example.

The first insulating layer 24 covers the top surface of the first electrode 19a and sidewalls of the spacers 20a of the first electrode structure 50 and the top surface of the dielectric structure 18. In some embodiments, the first insulating layer 24 is conformal with the electrode structure 50 and the dielectric structure 18.

In some embodiments, the first insulating layer 24 includes a first portion 24a, second portions 24b and third portions 24c connected to each other. The first portion 24a and the third portion 24c are extending along a first direction D1 which is parallel to the top surface of the dielectric structure 18. The first portion 24a is located on and covers the top surface of the first electrode 19a. The third portion 24c is located on and covers the top surface of the dielectric structure 18, and at sides of the first electrode 19a. In some embodiments, the bottom surface of the third portion 24c is substantially coplanar with the bottom surface of the first electrode structure 50.

The second portions 24b are located on the sidewalls 22 of the spacer 20a and between the first portion 24a and the third portion 24c, so as to cover the sidewalls 22 of the spacers 20a and connect the first portion 24a to the third portion 24c. In some embodiments, the second portion 24b is separated from the first electrode 19a by the spacer 20a therebetween. The second portion 24b is not perpendicular to the top surface of the dielectric structure 18, and the cross-shape of the second portion 24b may be arced, inclined, curved, or a combination thereof. An included angle between the second portion 24b and the bottom surface of the first electrode structure 50 (which is equal to the base angle β of the spacer 20a) is less than the base angle α of the first electrode 19a.

In other words, the end point A of the first portion 24a and the end point B of the third portion 24c (that is, the two end points of the second portion 24b contacting with the first portion 24a and the third portion 24c) are not aligned with each other in a second direction D2 which is perpendicular to the first direction D1, but are laterally offset from each other. The sidewall of the second portion 24b may have non-single slope or a very gentle slope. In some embodiments, the slope of the sidewall of the second portion 24b may change gradually, such as increased gradually from the end point A to the end point B.

Still referring to FIG. 2A, the second electrode structure 52 is formed on the first electrode structure 50 and is electrically isolated from the first electrode structure 50 by the first insulating layer 24 therebetween. In some embodiments, the second electrode structure 52 includes the second electrode 25a and spacers 28 on sidewalls of the second electrode 25a.

In some embodiments, the second electrode 25a is conformal with the first insulating layer 24. The second electrode 25a may be a step structure, and include first step portions 25b and a second step portion 25c on the first step portions 25b. The first step portions 25b are located on the third portion 24c of the first insulating layer 24a and at sides of the first electrode structure 50. The first step portion 25b is an asymmetric structure. In some embodiments, the sidewalls SW1 and SW2 of the first step portion 25b are not parallel to each other. In some embodiments, the profile of the sidewall SW1 and the base angle θ1 (that is, the included angle between the sidewall SW1 and the bottom surface of the second electrode 25a) of the second electrode 25a is similar to the profile of the sidewall 21 and the base angle α of the first electrode 19a, respectively. The profile of the sidewall SW1 and the base angle θ1 of the second electrode 25a may be the same as or different from the profile of the sidewall 21 and the base angle α of the first electrode 19a, respectively. The base angle θ1 ranges from 70° to 90°, for example. In some embodiments, the sidewall SW1 is extending along the second direction D2, and is perpendicular to the top surface of the dielectric structure 18. The sidewall SW2 is extending along the surface of the second portion 24b of the first insulating layer 24 and has a similar profile of that of the second portion 24b of the first insulating layer 24.

The second step portion 25c is located on the first electrode structure 50, the first portion 24a of the first insulating layer 24 and the first step portion 25b. In some embodiments, the cross-section shape of the second step portion 25c may be trapezoid with arced sidewalls. The width of the second step portion 25c increases gradually from the top surface to the bottom surface thereof. In some embodiments, the sidewall SW3 of the second step portion 25c has a similar profile as that of the second portion 24b of the first insulating layer 24. In some embodiments, the base angle θ2 of the second step portion 25c is less than the base angle θ1 of the first step portion 25b, the base angle β1 of the spacer 20a and the base angle α of the first electrode 19a. The base angle θ2 ranges from 30° to 70°, for example. In some embodiments, the slope of the sidewall SW1 of the first step portion 25b is steep, while the slope of the sidewall SW3 of the second step portion is gentle.

In some embodiments, the spacer 28 includes a first part 28a and a second part 28b. The first part 28a is located on the third portion 24c of the first insulating layer 24 and at a side of the first step portion 25b of the second electrode 25a, covering a portion of the top surface of the first insulating layer 24 and the sidewall SW1 of the first step portion 25b. The structural features of the first part 28a of the spacer 28 are similar to those of the spacer 20a, which is not described again. In some embodiments, the structural features of the first part 28a may be the same as or different from those of the spacer 20a.

The second part 28b is located on the first step portion 25a and at a side of the second step portion 25c of the second electrode 25a, covering at least a portion of the top surface of the first step portion 25b and the sidewall SW3 of the second step portion 25c. The base angle β3 of the second part 28b may be the same as or different from the base angel β2 of the first part 28a. In some embodiments, the base angle β3 is less than the base angle β2. The slope of the sidewalls of the second part 28b may be gentler than that of the first part 28a or that of the second step portion 25c. In some embodiments, the first part 28a and the second part 28b may be connected to each other, or separated from each other by the first step portion 25b.

In some embodiments, the second insulating layer 29 conformally covers the second electrode structure 52 and the first insulating layer 24. The second insulating layer 29 is separated from the sidewalls SW1 and SW3 of the second electrode 25a by the spacers 28 therebetween. The second insulating layer 29 includes a first portion 29a, a second portion 29b and a third portion 29c connected to each other. The first portion 29a is located on the second electrode structure 52. The third portion 29c is located on the third portion 24c of the first insulating layer 24. The first portion 29a and the third portion 29c are extending along the first direction D1. The second portion 29b is located on sidewalls of the spacers 28 and connects the first portion 29a and the third portion 29c. The second portion 29b is separated from the second electrode 25a by the spacers 28 therebetween. The profile of the second portion 29b may be arced, curved or inclined. The sidewall of the second portion 29b may include a very gentle slope or non-single slope. In some embodiments, the slope of the second portion 29b changes gradually from the end point contacting with the first portion 29a to the end point contacting with the third portion 29c.

In the forgoing embodiments, spacers are formed on sidewalls of both the first electrode and the second electrode, but the disclosure is not limited thereto. In some other embodiments, spacers may just be formed on sidewalls of the first electrode or sidewalls of the second electrode.

Referring to FIG. 2B, a MIM capacitor 100c includes a first electrode structure 150, a first insulating layer 124, a second electrode structure 152, a second insulating layer 129 and a third electrode structure 154. The structure of the MIM capacitor 100c is similar to the structure of the MIM capacitor 100b, and the difference lies in that the first electrode structure 150 does not include spacers on sidewalls of the first electrode 19a.

Still referring to FIG. 2B, the first electrode structure 150 includes the first electrode 19a and no spacer is formed on the sidewalls of the first electrode 19a. The top surface and the sidewalls of the first electrode 19a are covered and in contact with the first insulating layer 124. The other structural features of the first electrode 19a are similar to those described in the foregoing embodiments, and are not described again.

The second electrode structure 152 includes the second electrode 125a and the spacers 128 on sidewalls of the second electrode 125a. As no spacer is formed on sidewalls of the first electrode 19a, the cross-section shapes or profiles of the second electrode 125a and the spacers 128 may be a little different from those of the second electrode 25a and spacers 28 as shown in FIG. 2A.

In some embodiments, the second electrode structure 152 has a step structure, including a first step portion 125b and a second step portion 125c on the first step portion 125b. The first step portion 125b may be a symmetric or an asymmetric structure. The cross-section shape of the first step portion 125b may be square, rectangle, parallelogram, or the like. The sidewalls of the first step portion 125b may be straight or inclined. The base angle θ1' of the first step portion 125a may be in a same range of the base angle θ1 of the first step portion 25b as shown in FIG. 2A. The cross-section shape of the second step portion 125c may be rectangle, trapezoid, or the like. The sidewalls of the second step portion 125c may be straight or inclined. The base angle θ2' of the second step portion 125c may be the same as or less than the base angle θ1' of the first step portion 125b. In some embodiments, the base angle θ1' and the base angle θ2' range from 70° to 90°, respectively. In some embodiments, the sidewalls of the first step portion 125b and the second step portion 125c are parallel to each other.

The spacers 128 may include a first part 128a on sidewalls of the first step portion 125b and a second part 128b on sidewalls of the second step portion 125c. In some embodiments, the first part 128a and the second part 128b have similar cross-section shape or profile as that of the first part 28a of the spacers 28 (shown in FIG. 2A). The base angle β2' of the first part 128a and the base angle β3' of the second part 128b may be the same or different. In some embodiments, the base angle β2' and the base angle β3' may be less than the base angle θ1' and the base angle θ2', and in a range of 45° to 60°, respectively. In the embodiments shown in FIG. 2B, the first part 128a and the second part 128b are separated from each other by the first step portion 125a, but the disclosure is not limited thereto.

The second insulating layer 129 and the third electrode structure 154 conformally cover the first electrode structure 152 and the first insulating layer 124. The third electrode structure 154 includes the third electrode 130a.

In this embodiment, spacers are formed between sidewalls of the second electrode and the second insulating layer, and are not formed on sidewalls of the first electrode. In some other embodiments, spacers may be formed between sidewalls of the first electrode and the first insulating layer, and are not formed on sidewalls of the second electrode, and the structure of the capacitor formed will be similar to that of the capacitor 100b shown in FIG. 2A except for the spacers 28 are not formed.

In the foregoing embodiments, the spacers on sidewalls of the electrode shown in FIG. 2A or 2B are single-layer structure, but the disclosure is not limited thereto. In some embodiments in which the spacer material layer is a multi-layer structure, the spacers on sidewalls of the electrode may include multi-layer structure.

Figure 2C:
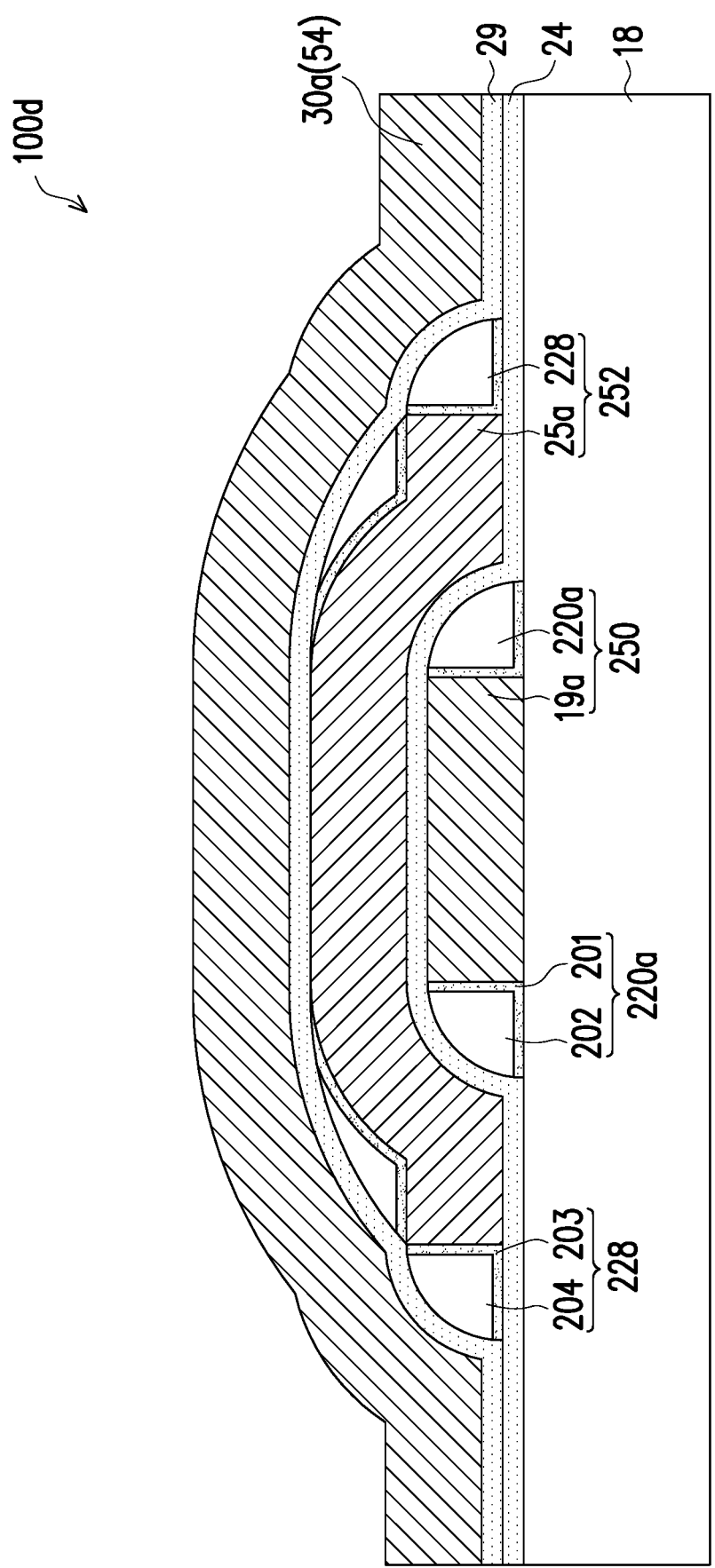

FIG. 2C is a schematic cross-sectional view illustrating an enlarged view of a MIM capacitor 100d according to some embodiments of the disclosure. The structure of the MIM capacitor 100d is similar to the structure of the MIM capacitor 100b shown in FIG. 2A, except that the MIM capacitor 100d includes a spacer having a multi-layer structure.

Referring to FIG. 2C, the MIM capacitor 100d includes a first electrode structure 250, a first insulating layer 24, a second electrode structure 252, a second insulating layer 29, and a third electrode structure 54 stacked on the dielectric structure 18. The first electrode structure 250 includes a first electrode 19a and spacers 220 on sidewalls of the first electrode 19a. The second electrode structure 252 includes a second electrode 25a and spacers 228 on sidewalls of the second electrode 25a. The third electrode structure 54 includes a third electrode 30a.

In some embodiments, the spacers 220a and the spacers 228 may be multi-layer structure, respectively. The spacer 220a includes a first spacer layer 201 and a second spacer layer 202 on the first spacer layer 201. The first spacer layer 201 is located between the sidewall of the first electrode 19a and the second spacer layer 202, and between the top surface of the dielectric structure 18 and the second spacer layer 202. The cross-section shape of the first spacer layer 201 may include L-shaped or the like. The first spacer layer 201 includes a material different from the materials of the first electrode 19a and the second spacer layer 202. The material of the second spacer layer 202 may be the same as or different from the material of the first electrode 19a. In some embodiments, the first spacer layer 201 is a dielectric layer, and the second spacer layer 202 is a conductive layer.

Similar to the spacer 220a, the spacer 228 includes a first spacer layer 203 and a second spacer layer 204. The materials of the first spacer layer 203 and the second spacer layer 204 are similar to, and may be the same as or different from the materials of the first spacer layer 201 and the second spacer layer 202, respectively. In some embodiments, the first spacer layer 203 is a dielectric layer, and the second spacer layer 204 is a conductive layer. The first spacer layer 203 is located between the second electrode 25a and the second spacer layer 202, or/and between the first insulating layer 24 and the second spacer layer 202. The other structural features of the capacitor 100d are substantially the same as the capacitor 100b shown in FIG. 1A, which is not described again.

In the embodiments of the disclosure, as spacers are formed on sidewalls of the electrode before the capacitor insulating layer is formed, the electrode structure including the spacers may have sidewalls with gentle slope or changing slope. Therefore, the capacitor insulating layer formed on the electrode structure may have a uniform thickness, and the corner thinning issue of the capacitor insulating layer is avoided, the issue of lower voltage breakdown and lower unit capacitance may be caused by the corner thinning issue are thus avoided. Therefore, the reliability of the MIM capacitor and the reliability of the semiconductor device are thus improved, meanwhile, the density and area of the MIM capacitor is kept.

In accordance with some embodiments of the disclosure, a MIM capacitor includes a first electrode, a second electrode, a third electrode, a first insulating layer, a second insulating layer, and a first spacer. The first electrode and the third electrode are electrically connected to each other. The first insulating layer is between the first electrode and the second electrode. The second insulating layer is between the second electrode and the third electrode. The first spacer is located between a sidewall of the first electrode and the first insulating layer.

In accordance with alternative embodiments of the disclosure, a MIM capacitor includes a first electrode structure, a second electrode structure and a third electrode structure stacked on a dielectric structure, a first insulating layer, a second insulating layer, a first contact, and a second contact. The first insulating layer is between the first electrode structure and the second electrode structure. The second insulating layer is between the second electrode structure and the third electrode structure. The first contact penetrates through and electrically connects the first electrode structure to the third electrode structure. The second contact penetrates through and is electrically connected to the second electrode structure. At least one of the first electrode structure and the second electrode structure comprises a combination of a conductive material and a dielectric material.

In accordance with some embodiments of the disclosure, a method of manufacturing a MIM capacitor includes the following steps. A first electrode structure is formed on a dielectric structure. A first insulating layer is formed on the first electrode structure. A second electrode structure is formed on the first insulating layer. A second insulating layer is formed on the second electrode structure. A third electrode structure is formed on the second insulating layer. At least one of forming the first electrode structure and forming the second electrode structure comprises forming an electrode and spacers on sidewalls of the electrode.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A MIM capacitor, comprising:
    a first electrode, a second electrode and a third electrode stacked on a dielectric structure, wherein the first electrode and the third electrode are electrically connected to each other;
    a first insulating layer between the first electrode and the second electrode;
    a second insulating layer between the second electrode and the third electrode; and
    a first spacer, located laterally between a sidewall of the first electrode and the first insulating layer,
    wherein the first insulating layer comprises a portion directly contacting a top surface of the dielectric structure, and a portion of the second electrode is located on the portion of the first insulating layer and laterally aside the first electrode.

2. The MIM capacitor of claim 1, wherein the first spacer has a first base angle less than a second base angle of the first electrode, and the first base angle is an acute angle.

3. The MIM capacitor of claim 2, wherein
    the first insulating layer includes a first portion on the first electrode, a second portion on a sidewall of the first spacer and a third portion on the dielectric structure;
    the first portion and the third portion are extending along a first direction;
    the second portion is on the first spacer, located between and connects the first portion and the third portion.

4. The MIM capacitor of claim 3, wherein the second portion includes a first end point in contact with the first portion and a second end point in contact with the third portion, the first end point and the second end point are staggered along a second direction perpendicular to the first direction.

5. The MIM capacitor of claim 4, wherein the slope of a sidewall of the second portion of the first insulating layer changes gradually from the first end point to the second end point.

6. The MIM capacitor of claim 1, wherein the first spacer is a single-layer structure, and comprises a dielectric material.

7. The MIM capacitor of claim 1, wherein the first spacer is a multi-layer structure, and comprises a dielectric material and a conductive material.

8. The MIM capacitor of claim 1, further comprising a second spacer between a sidewall of the second electrode and the second insulating layer.

9. The MIM capacitor of claim 1, further comprising a first contact and a second contact, wherein the first contact electrically connects the first electrode to the third electrode, the second contact is electrically connected to the second electrode.

10. A MIM capacitor, comprising:
    a first electrode structure, a second electrode structure and a third electrode structure stacked on a dielectric structure;
    a first insulating layer between the first electrode structure and the second electrode structure;
    a second insulating layer between the second electrode structure and the third electrode structure;
    a first contact, penetrating through and electrically connecting the first electrode structure to the third electrode structure; and
    a second contact, penetrating through and electrically connected to the second electrode structure;
    wherein the first electrode structure, the second electrode structure and the third electrode structure respectively comprise a conductive material, and at least one of the first electrode structure and the second electrode structure further comprises a dielectric material, wherein at least one of the first insulating layer and the second insulating layer comprises a portion laterally between the dielectric material of a corresponding electrode structure and the conductive material of another corresponding electrode structure,
    wherein the first electrode structure comprises a first electrode, comprising the conductive material, and first spacers on sidewalls of the first electrode, and the second electrode structure comprises a second electrode comprising the conductive material,
    wherein the first insulating layer comprises a part directly contacting a top surface of the dielectric structure, and a part of the second electrode is located on the part of the first insulating layer and laterally aside the first electrode,
    wherein a portion of the first insulating layer is separate from the first electrode by the first spacers therebetween.

11. The MIM capacitor of claim 10, wherein a base angle of at least one of the first electrode structure and the second electrode structure is less than 90°.

12. The MIM capacitor of claim 10, wherein a portion of a sidewall of at least one of the first insulating layer and the second insulating layer has a changing slope.

13. The MIM capacitor of claim 10,
    wherein the first spacers comprise the dielectric material.

14. The MIM capacitor of claim 10, wherein the second electrode structure comprises:
    the second electrode; and
    second spacers on sidewalls of the second electrode, wherein the second spacers comprise the dielectric material,
    wherein a portion of the second insulating layer is separate from the second electrode by the second spacers therebetween.

15. The MIM capacitor of claim 10, wherein
    the MIM capacitor is integrated in a semiconductor device; and the first contact and the second contact further penetrate through the dielectric structure to electrically connect to a conductive line of an interconnect structure of the semiconductor device.

16. A method of manufacturing a MIM capacitor, comprising:
forming a first electrode structure on a dielectric structure,
forming a first insulating layer on the first electrode structure;
forming a second electrode structure on the first insulating layer;
forming a second insulating layer on the second electrode structure; and
forming a third electrode structure on the second insulating layer,
wherein at least one of forming the first electrode structure and forming the second electrode structure comprises forming an electrode and spacers on sidewalls of the electrode,
wherein the first electrode structure comprises a first electrode and a first spacer, the first spacer is located laterally between a sidewall of the first electrode and the first insulating layer, and the second electrode structure comprises a second electrode;
wherein the first insulating layer comprises a portion directly contacting a top surface of the dielectric structure, and a portion of the second electrode is located on the portion of the first insulating layer and laterally aside the first electrode.

17. The method of claim 16, wherein forming the spacers on the sidewalls of the electrode comprises:
forming a spacer material layer on the electrode, wherein the spacer material layer covers a top surface and the sidewalls of the electrode; and
performing an etching process on the spacer material layer to remove the spacer material layer on the top surface of the electrode and remain the spacers on the sidewalls of the electrode.

18. The method of claim 17, wherein
forming the spacer material layer comprises forming a dielectric layer and a conductive layer on the dielectric layer; and
the dielectric layer serves as an etching stop layer during the etching process.

19. The method of claim 16, further comprising forming a first contact to penetrate through and electrically connect to the third electrode structure and the first electrode structure, and forming a second contact to penetrate through and electrically connect to the second electrode structure.

20. The method of claim 19, wherein the dielectric structure is formed on a conductive line of a semiconductor device, and the first contact and the second contact penetrate through the dielectric structure to electrically connect to the conductive line, wherein the first contact and the second contact are electrically isolated from each other.

* * * * *